US008697864B2

(12) United States Patent
Bedner et al.

(10) Patent No.: US 8,697,864 B2

(45) **Date of Patent: *Apr. 15, 2014**

(54) FLAME RETARDANT COMPOSITIONS WITH A PHOSPHORATED COMPOUND

(75) Inventors: David Bedner, Manchester, NH (US); William D. Varnell, Concord, NH (US)

(73) Assignee: Isola USA Corp., Chandler, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 13/411,823

(22) Filed: Mar. 5, 2012

(65) Prior Publication Data

US 2012/0277347 A1 Nov. 1, 2012

Related U.S. Application Data

(63) Continuation of application No. 11/269,132, filed on Nov. 8, 2005, now Pat. No. 8,129,456, which is a continuation-in-part of application No. 10/952,033, filed on Sep. 28, 2004, now Pat. No. 7,687,556.

(51) Int. Cl.
*C07D 251/40* (2006.01)

(52) U.S. Cl.
USPC .......................................................... 544/195

(58) Field of Classification Search
USPC .......................................................... 544/195
See application file for complete search history.

(56) References Cited

U.S. PATENT DOCUMENTS 4,180,630 A 12/1979 Sherif et al.
5,043,367 A 8/1991 Hallgren et al.
5,262,491 A 11/1993 Jain et al.
5,416,173 A 5/1995 Gagliani et al.
5,652,285 A 7/1997 Coggio et al.
6,054,515 A 4/2000 Blount
6,576,700 B2 6/2003 Patel
6,774,163 B2 8/2004 Janke et al.
6,875,387 B2 4/2005 Mhetar et al.
7,160,609 B2 * 1/2007 Wakizaka et al. ............. 428/332
8,129,456 B2 * 3/2012 Bedner et al. ................ 524/127
2003/0018131 A1 1/2003 Davis et al.
2004/0025743 A1 2/2004 Wakizaka et al.
2007/0093584 A1 * 4/2007 Hoerold et al. ............... 524/414

FOREIGN PATENT DOCUMENTS

CN 1306041 A 8/2001
CN 1469909 A 1/2004
CN 1639261 A 7/2005
EP 1 116 774 A2 7/2001
WO 9637532 A1 11/1996
WO 03027167 A1 4/2003

* cited by examiner

*Primary Examiner* — Nathan M Nutter

(74) *Attorney, Agent, or Firm* — Lando & Anastasi, LLP

(57) ABSTRACT

Flame retardant compositions that are halogen-free or substantially halogen-free are disclosed. In certain examples, the compositions comprise a halogen-free or substantially halogen-free epoxide and one or more phosphorated compounds. In some examples, the phosphorated compound comprises an average particle size less than 10 microns. In other examples, the phosphorated compound provides a surface area of 78.5 $\mu m^2$ to about 1965 $\mu m^2$. Prepregs, laminates, molded articles and printed circuit boards using the compositions are also disclosed.

12 Claims, 4 Drawing Sheets

FLAME RETARDANT COMPOSITIONS WITH A PHOSPHORATED COMPOUND

CROSS-REFERENCE TO RELATED APPLICATIONS

This application claims the benefit of, and is a continuation application of U.S. patent application Ser. No. 11/269,132 filed on Nov. 8, 2005 and entitled "FLAME RETARDANT COMPOSITIONS WITH A PHOSPHORATED COMPOUND," now U.S. Pat. No. 8,129,456, which is a continuation-in-part application of U.S. patent application Ser. No. 10/952,033 filed on Sept. 28, 2004 and entitled "FLAME RETARDANT COMPOSITIONS," now U.S. Pat. No. 7,687,556, the entire disclosure of each of which is hereby incorporated herein by reference in its entirety for all purposes.

PRIORITY CLAIM

This application claims the benefit of, and is a continuation-in-part application of, U.S. application Ser. No. 10/952,033 filed on Sep. 28, 2004 and entitled "Flame Retardant Compositions," the entire disclosure of which is hereby incorporated herein by reference for all purposes.

FIELD OF THE TECHNOLOGY

Certain examples disclosed herein relate generally to flame retardant compositions. More particularly, certain examples relate to flame retardant compositions that are halogen-free or substantially halogen-free and include a phosphorated chemical having a selected particle size, having a selected surface area, or both.

BACKGROUND

Curable flame retardant compositions with halogens have been used in printed circuit boards (PCBs). Glass fiber cloth laminates made from these compositions have excellent properties including low dielectric constants and dissipation factors. Products using these compositions also have higher toughness than typical epoxy glass laminates which have been used in PCBs.

Many of the compositions currently in use in printed circuit boards use brominated chemicals as flame retardants. Bromine, and other halogens, can generate dioxin during burning. Dioxin is very harmful to mammals, having an $LD_{50}$ about 0.022 mg/kg when administered orally to rats. In addition, substantial amounts of the halogen may be required to impart flame retardancy to the printed circuit board.

SUMMARY

Certain aspects and examples disclosed herein are directed to halogen-free or substantially halogen-free flame retardant compositions useful in prepregs, laminates, printed circuit boards, molded articles, and the like. More particularly, certain aspects and examples provide compositions that are prepared using a substantially halogen-free epoxide or a halogen-free epoxide along with a phosphorated particle of a selected size, or a phosphorated particle that provides a selected surface area. Such compositions provide the unexpected result of improved flame retardancy using lesser amounts of the phosphorated compound, generally in the form of a particle of smaller size and/or increased surface area, than the amount of halogen used to provide flame retardancy in a conventional composition. In certain examples, the compositions may be used to impregnate suitable materials to provide workable prepregs. Certain examples of the compositions provided herein are readily soluble or suspendable in suitable solvents to facilitate impregnation. Examples of the compositions disclosed herein are flame retardant, at least to some extent, have excellent dielectric properties and dimensional stability at high temperatures. Such properties allow for rapid assembly of, for example, prepregs, laminates, molded articles, and bonding sheets for printed circuit boards.

In accordance with a first aspect, a composition comprising at least one substantially halogen-free epoxide or halogen-free epoxide and an effective amount of at least one phosphorated compound to provide flame retardancy is disclosed. In certain examples, the phosphorated compound comprises an average particle size less than about 10 microns. In other examples, the phosphorated compound provides a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5 to about 30% by weight of a phosphorated compound having an average particle size less than 10 microns or about 5% to about 30% by weight of a phosphorated compound providing a surface area of at least about 78.5 $\mu m^2$ to about 1965 $\mu m^2$. In additional examples, the composition may include at least one non-halogenated flame retardant, a curative agent, a catalyst, a compatibilizing agent, a filler, a polyphenylene ether or other selected compounds to impart a desired property to the composition.

In accordance with an additional aspect, a halogen-free or substantially halogen-free composition having a glass transition temperature of at least about 120° C. is disclosed. In certain examples, the composition comprises a flame retardant amount of chemically combined phosphorous from a phosphorated compound. In certain examples, the phosphorated compound has an average particle size less than about 10 microns. In other examples, the phosphorated compound provides a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5% to about 30% by weight of a phosphorated compound having an average particle size less than 10 microns or about 5% to about 30% by weight of a phosphorated compound providing a surface area of at least about 78.5 $\mu m^2$ to about 1965 $\mu m^2$. In additional examples, the composition may include at least one polyepoxide, a polyphenylene ether, a non-halogenated flame retardant, a curative agent, a catalyst, a compatibilizing agent, a filler, or other selected compounds to impart a desired property to the composition.

In accordance with another aspect, a halogen-free or substantially halogen-free composition providing a peel strength of at least about 4.0 lb/inch width as tested by IPC-TM-650 2.4.8C is provided. In certain examples, the composition comprises a flame retardant amount of chemically combined phosphorous from a phosphorated compound. In certain examples, the phosphorated compound has an average particle size less than about 10 microns. In other examples, the phosphorated compound provides a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5% to about 30% by weight of a phosphorated compound having an average particle size less than 10 microns or about 5% to about 30% by weight of a phosphorated compound providing a surface area of at least about 78.5 $\mu m^2$ to about 1965 $\mu m^2$. In additional examples, the composition may include at least one polyepoxide, a polyphenylene ether, a non-halogenated flame retardant, a curative agent, a catalyst, a compatibilizing agent, a filler, or other selected compounds to impart a desired property to the composition.

In accordance with an additional aspect, a halogen-free or substantially halogen-free composition having a dielectric constant at 1 MHz (50% resin content) of about 5.0 or less as tested by IPC-TM-650 2.5.5.3C is disclosed. In certain examples, the composition comprises a flame retardant amount of chemically combined phosphorous from a phosphorated compound. In certain examples, the phosphorated compound has an average particle size less than about 10 microns. In other examples, the phosphorated compound may provide a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5% to about 30% by weight of a phosphorated compound having an average particle size less than 10 microns or about 5% to about 30% by weight of a phosphorated compound providing a surface area of at least about 78.5 $\mu m^2$ to about 1965 $\mu m^2$. In additional examples, the composition may include at least one polyepoxide, a polyphenylene ether, a non-halogenated flame retardant, a curative agent, a catalyst, a compatibilizing agent, a filler, or other selected compounds to impart a desired property to the composition.

In accordance with another aspect, a halogen-free or substantially halogen-free composition having a dielectric dissipation factor at 1 MHz (50% resin content) of about 0.035 or less as tested by IPC-TM-650 2.5.5.3C is provided. In certain examples, the composition comprises a flame retardant amount of chemically combined phosphorous from a phosphorated compound. In certain examples, the phosphorated compound is a compound having an average particle size less than about 10 microns. In other examples, the phosphorated compound provides a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5% to about 30% by weight of a phosphorated compound having an average particle size less than 10 microns or about 5% to about 30% by weight of a phosphorated compound providing a surface area of at least about 78.5 $\mu m^2$ to about 1965 $\mu m^2$. In additional examples, the composition may include at least one polyepoxide, a polyphenylene ether, a non-halogenated flame retardant, a curative agent, a catalyst, a compatibilizing agent, a filler, or other selected compounds to impart a desired property to the composition.

In accordance with an additional aspect, a halogen-free or substantially halogen-free composition having a flame retardancy of V-0 as defined by the UL-94 burn test is disclosed. In certain examples, the composition comprises a flame retardant amount of chemically combined phosphorous from a phosphorated compound. In certain examples, the phosphorated compound has an average particle size less than about 10 microns. In other examples, the phosphorated compound provides a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5% to about 30% by weight of a phosphorated compound having an average particle size less than 10 microns or about 5% to about 30% by weight of a phosphorated compound providing a surface area of at least about 78.5 $\mu m^2$ to about 1965 $\mu m^2$. In additional examples, the composition may include at least one polyepoxide, a polyphenylene ether, a non-halogenated flame retardant, a curative agent, a catalyst, a compatibilizing agent, a filler, or other selected compounds to impart a desired property to the composition.

In accordance with an additional aspect, a prepreg comprising a substrate with one or more of the compositions disclosed herein disposed on the substrate is provided. In certain examples, the composition disposed on the substrate comprises at least one substantially halogen-free epoxide or halogen-free epoxide and at least one phosphorated compound. In certain examples, the phosphorated compound has an average particle size less than about 10 microns. In other examples, the phosphorated compound comprises a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5% to about 30% by weight of a phosphorated compound having an average particle size less than 10 microns or about 5% to about 30% by weight of a phosphorated compound providing a surface area of at least about 78.5 $\mu m^2$ to about 1965 $\mu m^2$. In additional examples, the composition may include at least one polyepoxide, a polyphenylene ether, a non-halogenated flame retardant, a curative agent, a catalyst, a compatibilizing agent, a filler, or other selected compounds to impart a desired property to the composition. Additional features for including in prepregs will be readily selected by the person of ordinary skill in the art, given the benefit of this disclosure.

In accordance with another aspect, a laminate comprising at least two layers wherein, prior to curing, one layer is a prepreg is disclosed. In certain examples, the prepreg comprises a first material impregnated with a composition comprising at least one halogen-free epoxide or at least one substantially halogen-free epoxide and at least one phosphorated compound. In certain examples, the phosphorated compound has an average particle size less than about 10 microns. In other examples, the phosphorated compound provides a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5% to about 30% by weight of a phosphorated compound has an average particle size less than 10 microns or about 5% to about 30% by weight of a phosphorated compound providing a surface area of at least about 78.5 $\mu m^2$ to about 1965 $\mu m^2$. In additional examples, the composition may include at least polyepoxide, a polyphenylene ether, a non-halogenated flame retardant, a curative agent, a catalyst, a compatibilizing agent, a filler, or other selected compounds to impart a desired property to the composition. In some examples, the laminate comprises two or more prepregs wherein each prepreg of the laminate is impregnated with the same composition, whereas in other examples, the prepregs of the laminate are impregnated with different compositions. In certain examples, the laminate is formed by laminate molding. Additional features for including in laminates will be readily selected by the person of ordinary skill in the art, given the benefit of this disclosure.

In accordance with yet an additional aspect, a molded article comprising a plurality of layers impregnated with a composition comprising at least one halogen-free epoxide or at least one substantially halogen-free epoxide and at least one phosphorated compound is provided. In certain examples, the phosphorated compound has a particle size less than about 10 microns. In other examples, the phosphorated compound provides a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5% to about 30% by weight of a phosphorated compound having an average particle size less than 10 microns or about 5% to about 30% by weight of a phosphorated compound providing a surface area of at least about 78.5 $\mu m^2$ to about 1965 $\mu m^2$. In additional examples, the composition may include at least one polyepoxide, a polyphenylene ether, a non-halogenated flame retardant, a curative agent, a catalyst, a compatibilizing agent, a filler, or other selected compounds to impart a desired property to the composition. Additional features for including in molded articles will be readily selected by the person of ordinary skill in the art, given the benefit of this disclosure.

In accordance with another aspect, a printed circuit board comprising a dielectric substrate impregnated with one or more of the composition disclosed herein and having an electrically conductive layer on at least one surface of the dielectric substrate is provided. In certain examples, a printed circuit board comprises a dielectric substrate having an electrically conductive layer, e.g., a wiring layer, on one or both surfaces. In certain examples, the electrically conductive layer may be formed to have a predetermined pattern. In examples employing multiple electrically conductive layers, the layers may be connected electrically with each other. In some examples, the dielectric substrate comprises a glass cloth or a glass non-woven fabric impregnated with a composition comprising at least one halogen-free epoxide or at least one substantially halogen-free epoxide and at least one phosphorated compound. In certain examples, the phosphorated compound has a particle size less than about 10 microns. In other examples, the phosphorated compound provides a surface area of at least about 78.5 $\mu m^2$ to about 1965 $\mu m^2$. In some examples, the composition comprises about 40% to about 90% by weight of a substantially halogen-free epoxide or a halogen-free epoxide. In other examples, the composition may also include about 5% to about 30% by weight of a phosphorated compound, e.g., about 5% to about 30% by weight of a phosphorated compound having an average particle size less than 10 microns or about 5% to about 30% by weight of a phosphorated compound providing a surface area of at least about 78.5 $\mu m^2$ to about 1965 $\mu m^2$. In additional examples, the composition may include at least one polyepoxide, a polyphenylene ether, a non-halogenated flame retardant, a curative agent, a catalyst, a compatibilizing agent, a filler, or other selected compounds to impart a desired property to the composition. In other examples, the dielectric substrate comprises a glass cloth or a glass non-woven fabric impregnated with a composition comprising at least one halogen-free epoxide or at least one substantially halogen-free epoxide, and at least one phosphorated compound from particles providing an effective surface area of at least about 78.5 $\mu m^2$ to about 1965 $\mu m^2$. Additional features for including in printed circuit boards articles will be readily selected by the person of ordinary skill in the art, given the benefit of this disclosure.

In accordance with a method aspect, a method of facilitating prepreg assembly is provided. The method comprises providing one or more halogen-free or substantially halogen-free compositions, such as those described herein. In certain examples, the halogen-free or substantially halogen-free composition comprises one or more of a polyphenylene ether, an epoxide and a phosphorated compound, e.g., a phosphorated compound having a particle size less than about 10 microns or a phosphorated compound providing a surface area of at least about 78.5 $\mu m^2$ to about 1965 $\mu m^2$.

The compositions disclosed herein, and devices using the compositions disclosed herein, provide a significant advance. Flame retardant compositions, and devices using the flame retardant compositions, can be produced to provide low cost, environmentally friendly products as well as products with reduced toxicity. These and other aspects, examples and advantages are described in more detail below.

BRIEF DESCRIPTION OF THE FIGURES

Certain specific examples are described below with reference to the accompanying figures in which.

Figure 1:
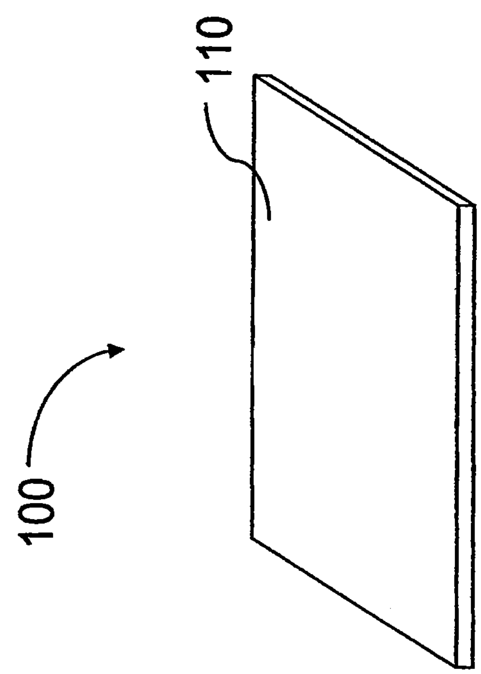
FIG. 1 is an example of a prepreg, in accordance with certain examples.

The features of the figures are not necessarily to scale and certain features in the figures may have been enlarged or distorted relative to other features to provide a more user-friendly description of the illustrative features, aspects and examples described herein.

DETAILED DESCRIPTION

It will be recognized by the person of ordinary skill in the art, given the benefit of this disclosure, that the compositions and devices using the compositions provide significant advantages not achieved with prior compositions. The compositions can be used in assembly of various single and multi-layered structures including, but not limited to, laminates, printed circuit boards, molded articles, aircraft plastics, silicon chip carriers, structural composites, resin coated foils, unreinforced substrates for high density circuit interconnect applications, power supplies and other suitable applications where it may be desirable to use single or multi-layered structures having flame retardant and/or dielectric properties. In the examples described below, all percentages are weight percentages based on the total composition unless otherwise clear from the context. Any reference to chemical formulas or chemical structures is not intended to imply any particular stereochemistry, bond lengths, bond angles or the like unless otherwise clear from the context.

In accordance with certain examples, certain compounds or compositions disclosed herein are substantially halogen-free or halogen-free. As used herein the term "substantially halogen-free" refers to compositions that do not include any covalently bonded halogen groups in the final composition, but may include minimal amounts of residual halogens that, for example, are present in any remaining halogenated solvent or residual amounts of halogen that leaches from any containers used to prepare and/or store the compositions. In certain examples, substantially halogen-free refers to less than about 0.15% by weight total halogen content in the final composition, more particularly less than about 0.10% by weight total halogen content in the final composition. Though residual amounts of halogen may be present in the final compositions, it is believed that the residual amount does not impart, or retract from, the physical properties, e.g., flame retardancy, peel strength, dielectric properties, etc., of the final composition. In addition, any residual amounts of halogen that are present do not generate appreciable amounts of dioxin, or other toxic substances, during burning to be considered a health hazard to mammals, such as humans.

In accordance with certain examples, a halogen-free or substantially halogen-free composition that includes a flame retardant amount of chemically combined phosphorous from a phosphorated compound is disclosed. As used herein a "flame retardant amount of chemically combined phosphorous" refers to a sufficient amount of phosphorous to provide a composition that has a flame retardancy of V-0 as defined by the UL-94 burn test. In certain examples, the composition includes about 3.0 to about 6.0% by weight chemically combined phosphorous. In other examples, the composition includes about 3.5% to about 6.0% by weight chemically combined phosphorous. In certain other examples, the composition includes about 3.5% to about 5.5% by weight chemically combined phosphorous. In yet other examples, the flame retardant amount of chemically combined phosphorous is about 3.5% to about 5.0% by weight chemically combined phosphorous, e.g., about 4.0% to about 5.0% by weight. The exact chemical form of the phosphorous can vary based on the composition. For example, the phosphorous may be present as a phosphate compound, e.g., a monophosphate, diphosphate, triphospate, bis-phosphate, tris-phosphate, etc. In certain other examples, the phosphorous may be present as a phosphonate compound. Additional suitable compounds that include one or more phosphorous atoms will be readily selected by the person of ordinary skill in the art, given the benefit of this disclosure. In certain examples, the phosphorous originates from phosphorated chemicals, e.g., inorganic and organic phosphates. For example, in certain examples, the phosphorated compound has a formula as shown below in formulae (I)-(IV).

(I)

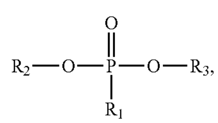

(II)

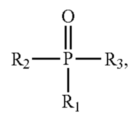

(III)

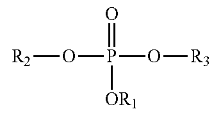

-continued (IV)

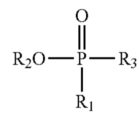

In formulae (I)-(IV), $R_1$, $R_2$ and $R_3$ each may be independently selected from the group consisting of alkyl, aryl, and alicyclic and heterocyclic groups that include nitrogen, oxygen and/or phosphorous. In certain examples, $R_1$, $R_2$, and $R_3$ each is independently selected from primary or secondary lower alkyl (e.g., C1-C7 alkyl), primary or secondary lower alkenyl, (e.g. C2-C7 alkenyl), primary or secondary lower alkynyl (e.g., C2-C7 alkynyl), aryl, and alicyclic and heterocylic groups that include nitrogen, oxygen and phosphorous. In some examples, an effective amount of a phosphorated compound provides flame retardancy to the composition. Such effective amount of a phosphorated compound may be, for example, any of the illustrative ranges disclosed herein or any value falling within such illustrative ranges.

In accordance with certain examples, the phosphorated compound may take the form of particles having a mean particle diameter of less than about 10 microns. In some examples, the particles have an average diameter of any value less than about 10 microns, including intervening or intermediate values less than 10 microns, e.g., fractional values and the like. For example, suitable screens, filters or filtration media can be used to select particles with a mean diameter less than a desired value, e.g., a 10 micron filter can be used such that only particles having a diameter of less than 10 microns will pass through the filter. Alternatively, a 5 micron filter could be used to select particles that are less than 5 microns in diameter. Suitable filtration media and filters include, for example, supor polyethersulfone media, cellulose acetate media, cellulose nitrate media, polytetrafluoroethylene (PTFE) and media and techniques commonly used with centrifugation.

In accordance with certain examples, the amount of phosphorated compound (in the composition) with a selected particle size may vary from about 5% to about 30% by weight, more particularly about 10% to about 18% by weight, e.g., about 12% to about 17% by weight. Preferably, an effective amount of the phosphorated compound is present to provide flame retardancy to the composition.

In accordance with certain examples, processing of the particles to provide a desired particle size may be accomplished using, for example, milling, a mortar and pestle, grinding wheels, using filtration or using centrifugation techniques, such as gradient density centrifugation, for example.

In accordance with certain examples, the compositions disclosed herein may also include a phosphorated compound that provides a surface area of at least about 78.5 $\mu m^2$ to about 1965 $m^2$. These values were estimated by assuming a spherical particle shape for the phosphorated compound. It will be recognized by the person of ordinary skill in the art, however, that the surface area may be more or less depending on the exact shape of the particle. For example, the surface area of a spherical particle may differ from the surface area of a particle having a cube-shape, an elliptical shape, a rod-shape, etc. The exact particle shape may be determined using suitable techniques and devices, e.g., a Beckman RapidVUE® Particle Shape and Size Analyzer, that will be readily selected by the person of ordinary skill in the art, given the benefit of this disclosure. Without wishing to be bound by any particular scientific theory, it is believed that phosphorous coated, attached or otherwise disposed on an external surface of a moiety such as a particle, or particles comprising phosphorated groups, for example, provides flame retardancy to the composition. If surface area can be increased, then better flame retardant properties may be achieved. In certain examples, the amount of phosphorated compound that provides a selected surface area may vary from about 5% to about 30% by weight, more particularly about 10% to about 18% by weight, e.g., about 11% to about 17% by weight.

In accordance with certain examples, illustrative phosphorated compounds include, but are not limited to, Melapur®-200 and Melapur®-MP compounds (commercially available from CIBA Specialty Chemicals (Tarrytown, N.Y.)) that has been processed to have a mean particle size of about 8 to about 10 microns or less. Other illustrative materials that may be used as a phosphorated compound include, but are not limited to, Exolit® APP-422 and Exolit® APP-423 ammonia polyphosphates (commercially available from Clariant (Germany)), Arafil-72 and Arafil-76 ammonia polyphosphates (commercially available from Huntsman (Salt Lake City, Utah)) and Antiblaze® MC ammonia polyphosphate (commercially available from Albemarle (Baton Rouge, La.)), Fyrol®-MP melamine polyphosphate (commercially available from Akzo Nobel (Chicago, Ill.)), and OP-930 and OP-1230 organic phosphonates (commercially available from Clariant (Germany)). Other suitable phosphorous containing compounds, such as ammonium phosphates, metal/phosphorous compounds, ammonium polyphosphates, melamine phosphates, melamine polyphosphates, red phosphorus and other organic and nitroorganic phosphorous compounds will be readily selected by the person of ordinary skill in the art, given the benefit of this disclosure.

In accordance with certain examples, the compositions disclosed herein may include one or more halogen-free epoxides or substantially halogen-free epoxides. In certain examples, any epoxide that is halogen-free or substantially halogen-free and having one or more epoxide functionalities can be used in the compositions disclosed herein. As used herein, the term "polyepoxide" refers to compounds having two or more epoxide functionalities. In some examples, a difunctional epoxide or a tetrafunctional epoxide may be used in the compositions disclosed herein. The epoxides may be aromatic or may be aliphatic. Exemplary commercially available epoxides that can be used in the compositions disclosed herein include, but are not limited the Epon® family of bisphenol-A epoxides, e.g., Epon-826, Epon-828, Epon-1001 and Epon-1031 (commercially available from Resolution (Houston, Tex.) now Hexion), DER-331 and DER-332 bisphenol-A epoxides (commercially available from Dow (Midland, Mich.)), and GY-6010 and GY-6020 bisphenol-A epoxides (commercially available from Huntsman (Austin, Tex.)). Other commercially available epoxides that can be used in the compositions disclosed herein include bisphenol-F epoxides, such as Epon-862 bisphenol-F epoxide (commercially available from Resolution (Houston, Tex.) now Hexion) and GY-281, GY-282 and GY-285 bisphenol-F epoxides (commercially available from Huntsman (Austin, Tex.)). Additional commercially available epoxides that can be used in the compositions disclosed herein include novolac epoxides, such as Epon-1050 and Epon-164 novolac epoxides (commercially available from Resolution (Houston, Tex.)), DER-431 and DER-432 novolac epoxides (commercially available from Dow (Midland, Mich.)), and EPN-1080, EPN-1138 and ECN-1273 novolac epoxides (commercially available from Huntsman (Austin, Tex.)). In some examples, a phenol/formaldehyde novolac, a cresol/formaldehyde novolac, a bis-phenol A/formaldehyde novolac or a phenol/formaldehyde novolac may be used in the compositions disclosed herein. Yet other commercially available epoxides that can be used in the compositions disclosed herein include cycloaliphatic epoxides, such as ERL-4221 epoxide (commercially available from Union Carbide (Houston, Tex.)) and CY 179MA epoxide (commercially available from Huntsman (Austin, Tex.)). In additional examples, MY0500, MY721, and MY722 epoxides (commercially available from Huntsman and other suppliers) may be used as the epoxide component. Additional commercially available epoxides will be readily selected by the person of ordinary skill in the art, given the benefit of this disclosure.

In accordance with certain examples, the epoxide component of certain compositions disclosed herein comprises at least one bisphenol polyglycidyl ether. In certain examples, the epoxide component may include at least one bisphenol polyglycidyl ether having an average of at most one aliphatic hydroxy group per molecule. In some examples, the epoxide component comprises a mixture of bisphenol polyglycidyl ethers. In certain examples, the epoxide component may be halogen-free or substantially halogen-free. Epoxide and polyepoxide compounds can be prepared conventionally by the reaction of bisphenols with epichlorohydrin. Such polyepoxide compounds may be represented, for example, by formula V:

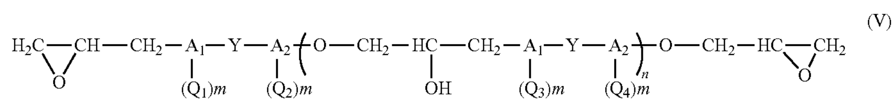

(V)

In formula II, $Q_1$, $Q_2$, $Q_3$ and $Q_4$ are each independently selected from the group consisting of hydrogen, lower alkyl, lower alkenyl, lower alkynyl, and aryl. Y is selected from substituted and unsubstituted aryl, m is 0 to 4, n has an average value no greater than about 4 and in certain examples n has an average value up to about 1. In certain examples, each of $A_1$ and $A_2$ can be a monocyclic divalent aromatic radical and Y can be a bridging radical in which one or two atoms separate $A_1$ from $A_2$. In certain examples, the O-$A_1$ and $A_2$-O bonds in formula II may be in the meta- or para-positions of $A_1$ and $A_2$ in relation to Y. In formula II, the $A_1$ and $A_2$ values may be unsubstituted phenylene or substituted derivatives thereof, illustrative substituents (one or more) being alkyl, nitro, alkoxy and the like. In certain examples, unsubstituted phenylene radicals are used. Each of $A_1$ and $A_2$ may, for example, be ortho-phenylene or meta-phenylene and the other para-phenylene, but in certain examples, both $A_1$ and $A_2$ are para-phenylene. In certain examples, the bridging radical, Y, is one in which one or two atoms separate $A_1$ and $A_2$. In some examples, Y is a hydrocarbon radical and particularly a saturated radical such as methylene, cyclohexylmethylene, ethylene, isopropylidene, neopentylidene, cyclohexylidene or cyclopentadecylidene, especially a gem-alkylene (alkylidene) radical and more particularly isopropylidene. In other examples, Y may be a radical that contains atoms other than carbon and hydrogen; for example, carbonyl, oxy, thio, sulfoxy, and sulfone. It will be within the ability of the person of ordinary skill in the art, given the benefit of this disclosure, to select suitable epoxides ad polyepoxides for use in the compositions disclosed here.

In accordance with certain examples, an epoxide having formula (VI) as shown below may be used in the compositions disclosed herein.

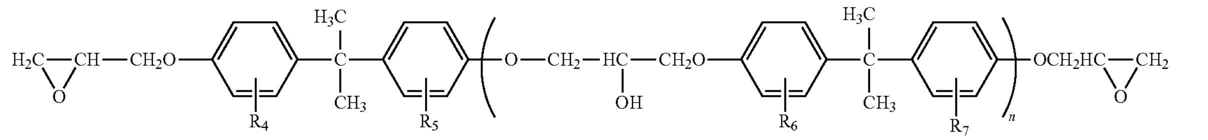

In the formula shown above, $R_4$, $R_5$, $R_6$, and $R_7$ may each be independently selected from the group consisting of hydrogen, lower alkyl, lower alkenyl and lower alkynyl, and in which n has an average value between 0 and 4, more particularly n is about 1. In certain examples, $R_4$, $R_5$, $R_6$ and $R_7$ are each hydrogen.

In accordance with certain examples, the compositions disclosed herein may also include one or more curing agents. In some examples, a first epoxide and a second epoxide may be used such that one of the first and second epoxides is functional as a curing agent. In other examples, the curing agent may be an aromatic amine, an aliphatic amine or a guanidine compound. Illustrative aromatic amines include, but are not limited to, diethyltoluenediamine, 4,4'-methylenedianiline, Amicure 101 curing agent, Ancamine 9360 curing agent, Ancamine 9470 curing agent, Ancamine Y curing agent, Ancamine Z curing agent (Air Products), Curing Agent W (Hexion), and HY5200 curing agent (Huntsman). Additional commercially available aromatic amines suitable for use in the compositions disclosed herein will be readily selected by the person of ordinary skill in the art, given the benefit of this disclosure. Illustrative commercially available aliphatic amines, include, but are not limited to, Epikure™ curing agents, Ancamine™ curing agents and the like. Additional commercially available aliphatic amines will be readily selected by the person of ordinary skill in the art, given the benefit of this disclosure. Illustrative commercially available guanidine compounds include but are not limited to dicyandiamide (available from Alfa Aesar (Ward Hill, Mass.)), Aradur® compounds, e.g., Aradur® 2844 available from Huntsman Chemical (Salt Lake City, Utah) and the like. Additional commercially available guanidine compounds will be readily selected by the person of ordinary skill in the art, given the benefit of this disclosure.

In accordance with certain examples, the compositions disclosed herein may also include a co-flame retardant compound. The phosphorated compound of the compositions disclosed herein provides, at least in part, flame retardancy to the composition. A co-flame retardant compound may also be included in the compositions disclosed herein to act synergistically with the phosphorous compound to provide flame retardancy to the composition, though a significant advantage of the compositions disclosed herein is that flame retardancy synergists, such as antimony pentoxide, are unnecessary. However, flame retardancy synergists may be incorporated when appropriate. When a flame retardancy synergist is employed, it preferably is maintained in stable dispersion. This dispersion may be accomplished by agitation and/or combination with a suitable dispersing agent, of which many are known in the art. The proportion of co-flame retardant may be up to about 10 parts per 100 parts of the epoxide component.

In accordance with certain examples, the compositions disclosed herein may include one or more catalysts and/or accelerators, such as cure accelerators. The catalysts and/or cure accelerators may speed up curing of the composition when used, for example, in a prepreg or laminate. In certain examples, the catalyst is one or more imidazoles and/or arylene polyamines. In particular, an imidazole catalyst can be, for example, imidazole, 1-methylimidazole, 1,2-dimethylimidazole, 2-methylimidazole, 2-heptadecylimidazole, 2-ethyl-4-methylimidazole, 2-undecylimidazole, and 1-(2-cyanoethyl)-2-phenylimidazole. Suitable commercially available imidazoles include, but are not limited to, Curezol® 2E4MZ, Curezol® C17Z, and Curezol® 2PZ (commercially available from Air Products (UK)). Illustrative arylene polyamine catalysts include, but are not limited to, diethyltoluenediamine, tris(dimethylaminomethyl)phenol, and 3-phenyl-1,1-dimethyl urea. In other examples, imidazole-arylene polyamine mixtures can be used; in particular, mixtures including arylene polyamines with a high degree of alkyl substitution on the aromatic ring, typically at least three such substituents, can be used. For example, diethylmethyl-substituted meta- and para-phenylenediamines can be used as polyamine catalysts. Tertiary amines such BDMA (benzodimethylamine) and 1,8-Diazabicyclo(5,4,0)-7-undecene may also be used. N-methyl piperazine, triaryl phosphines, phosphonium salts, and substituted ureas, such as 1,1-Dimethyl-3-phenylurea and 1,1'-(4-methyl-m-phenylene)bis[3,3-dimethylurea and 1,1'-(4-Methyl-m-phenylene)bis(3,3'-dimethylurea) may also be used as catalysts. Additional catalysts and/or cure accelerators will be readily selected by the person of ordinary skill in the art, given the benefit of this disclosure. The catalysts and/or cure accelerators may be used alone or may be used in combination with one or more other catalysts and/or cure accelerators.

In accordance with certain examples, the exact amount of catalyst can vary depending on the make-up of the compositions. In at least certain examples, a catalytically effective amount of catalyst is used to achieve curing after solvent removal. In certain examples, at least about 0.5 parts catalyst per 100 parts epoxide, more particularly about 0.1 parts catalyst per 100 parts epoxide, e.g., about 0.01 or 0.02 parts catalyst per 100 parts epoxide. When a polyphenylene ether essentially free from basic nitrogen is employed, it may be desirable to increase the proportion of catalyst to provide reasonable reaction rates.

In accordance with certain examples, co-catalysts and activators can be used to achieve advantageous cure rates. Salts of diketones in which one carbon atom separates the carbonyl groups, especially acetylacetonates, and salts of fatty acids, especially stearates and octoates, are examples of suitable forms of zinc, magnesium, or aluminum for this purpose. Specific examples include zinc acetylacetonate, zinc stearate, magnesium stearate, aluminum acetylacetonate, zinc octoate, zinc neodecanoate, and zinc naphthenate. Additional secondary catalysts include, for example, maleic anhydride and $BF_3$-ethylamine complex. In certain examples, co-catalysts can be employed in a co-catalytically effective amount, and may also serve to improve solvent resistance and flame retardancy. For example, about 0.1% to about 1.5% by weight of zinc, magnesium, or aluminum, based on total curable composition, can be present as a co-catalyst. Under certain conditions, acetylacetonates such as zinc acetylacetonate can form hydrates which readily lose acetylacetone and become insoluble in the organic systems used for laminate preparation. Therefore, it may be desirable to take steps to maintain the zinc or aluminum in stable dispersion. One method for dispersing is to subject the composition to continuous agitation. An additional method is to form an alcoholate of the acetylacetonate, as by reaction with methanol. The alcoholate loses alcohol rather than acetylacetonate under similar conditions, remaining in solution or homogeneous suspension.

In accordance with certain examples, the compositions disclosed herein may also include one or more polyphenylene ether compounds. The polyphenylene ether compound typically has two or more structural units as shown in formula (VII).

(VII)

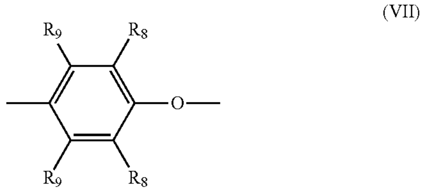

In certain examples, each of $R_8$ and $R_9$ is independently selected from hydrogen, primary or secondary lower alkyl (e.g., alkyl containing between about 1-7 carbon atoms), primary or secondary lower alkenyl (e.g., alkenes containing between about 2-7 carbon atoms), primary or secondary lower alkynyl (e.g., alkynes containing between about 2-7 carbon atoms), phenyl, aminoalkyl, diaminoalkyl, acyl, and hydrocarbonoxy. Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-, 3-, or 4-methylpentyl and the corresponding heptyl groups. Examples of secondary lower alkyl groups are isopropyl, sec-butyl, and 3-pentyl. In certain examples, any alkyl radicals are straight chain rather than branched. Most often, each $R_8$ is alkyl or phenyl, especially C1-4 alkyl, and each $R_9$ is hydrogen. In certain other examples, each $R_8$ and $R_9$ is independently selected from acetyl, formyl and other groups containing at least one carbonyl moiety. In certain examples, the polyphenylene ether component may be present from about 30% to about 80% by weight, more particularly about 30% to about 50% by weight, e.g., about 40% to about 45% by weight.

In accordance with certain examples, polyphenylene ethers for use in the compositions disclosed herein may include, but are not limited to, homopolymer and copolymer polyphenylene ethers such as those commercially available from General Electric (Schenectady, N.Y.) and Asahi Chemicals (Kawasaki, Japan). For example, suitable homopolymers include, but are not limited to, those containing 2,6-dimethyl-1,4-phenylene ether units. Suitable copolymers include, but are not limited to, random copolymers containing such units in combination with, for example, 2,3,6-trimethyl-1,4-phenylene ether units. Suitable random copolymers, as well as suitable homopolymers, will be readily selected by the person of ordinary skill in the art, given the benefit of this disclosure. Exemplary commercially available polyphenylene ethers include the Noryl® brand of polyphenylene ethers, e.g., Noryl® PPO® polyphenylene ether (available from General Electric (Schenectady, N.Y.)). Additional commercially available polyphenylene ethers will be readily selected by the person of ordinary skill in the art, given the benefit of this disclosure.

In accordance with certain examples, polyphenylene ethers containing moieties which modify properties such as molecular weight, melt viscosity, and/or impact strength can also be used in the compositions disclosed herein. In certain examples, such property modifying moieties are halogen-free or substantially halogen-free. Such polymers will be readily selected by the person of ordinary skill in the art, given the benefit of this disclosure, and exemplary polymers may be prepared by grafting onto a polyphenylene ether in a known manner such non-hydroxy-containing vinyl monomers as acrylonitrile and vinylaromatic compounds (e.g., styrene), or such non-hydroxy-containing polymers as polystyrenes and elastomers. The resulting product may contain both grafted and ungrafted moieties. Other suitable polymers are the coupled polyphenylene ethers in which the coupling agent is reacted in known manner with the hydroxy groups of two polyphenylene ether chains to produce a higher molecular weight polymer containing the reaction product of the hydroxy groups and the coupling agent. Illustrative coupling agents are low molecular weight polycarbonates, quinones, heterocycles, and formals. Other suitable coupling agents will be readily selected by the person of ordinary skill in the art, given the benefit of this disclosure.

In accordance with certain examples, polyphenylene ethers used in the compositions disclosed herein may have a number average molecular weight within the range of about 3,000 to about 50,000, more particularly at least about 10,000 to about 20,000, e.g., at least about 15,000. In certain examples, polyphenylene ethers have a weight average molecular weight within the range of about 20,000 to about 100,000 as determined by gel permeation chromatography, more particularly about 30,000 to about 80,000, e.g., about 50,000. In certain examples, the polyphenylene ethers have an intrinsic viscosity in the range of about 0.35 to about 0.6 dl/gram, more particularly about 0.35 to about 0.5 dl/gram, e.g., about 0.4 dl/gram, as measured in chloroform at 25° C.

In accordance with certain examples, polyphenylene ethers can be prepared by the known oxidative coupling of at least one corresponding monohydroxyaromatic compound. Particularly useful and readily available monohydroxyaromatic compounds are 2,6-xylenol (wherein each $R_8$ and one $R_9$ of formula I is methyl and the other $R_9$ of formula I is hydrogen), whereupon the polymer may be characterized as a poly(2,6-dimethyl-1,4-phenylene ether), and 2,3,6-trimethylphenol (wherein each $R_8$ and one $R_9$ of formula I is methyl and the other $R_9$ is hydrogen). In certain examples polyphenylene ethers comprising molecules having aminoalkyl-substituted end groups, as described in numerous patents and publications, can be used. In certain examples, such molecules frequently constitute a substantial proportion of the polyphenylene ether, typically as much as about 90% by weight. Polymers of this type may be obtained by incorporating an appropriate primary or secondary monoamine as one of the constituents of the oxidative coupling reaction mixture.

In accordance with certain examples, the polyphenylene ether component, optionally, can be "equilibrated" by prereaction with an initiator, such as, for example, benzoyl peroxide, 2,2'-azo-bis-isobutyrylnitrile, lauroyl peroxide, tert-butyl peroxy-2-ethylhexanoate and tert-amyl peroxy-2-ethylhexanoate, in the presence of a bisphenol, such as bisphenol A (or the like), thereby reducing the molecular size of the polyphenylene ether chains via a cleavage reaction. As used herein, the term "bisphenol" refers to a compound containing two hydroxyphenyl groups attached to an aliphatic or cycloaliphatic moiety, which may also contain aromatic substituents. Without wishing to be bound by any particular scientific theory, the use of equilibrated polyphenylene ether can result in a marked reduction in varnish mix viscosity and can produce better fabric saturation and higher flow prepreg in the treating operation.

In accordance with certain examples, in embodiments where the composition includes a polyphenylene ether, it may be desirable to include one or more compatibilizing agents in the composition. Without wishing to be bound by any particular scientific theory, compatibilizing agents may be used to improve the solubility or miscibility of compounds or chemicals that are not typically soluble with each other. In certain examples, the compatibilizing agent is an intermediate that typically is soluble with both reagents and helps keep the total solution homogeneous. The exact nature of the compatibilizing agent can vary depending on the selected polyphenylene ether and selected epoxide. In certain examples, the compatibilizing agent is a non-metal agent, e.g., surfactant, dispersing agent, etc. In some examples, a poly(styrene maleic anhydride), such as SMA EF-40, SMA EF-60, etc. (Sartomer Company, Inc., (Exton, Pa.)) may be used as a compatibilizing agent. In other examples, a polyol may be used as a compatibilizing agent.

In certain examples, the compatibilizing agent is a transition metal salt that is present in an amount effective to compatabilize the polyphenylene ether and epoxide components. For example, a salt of zinc or tin may be used to compatabilize the polyphenylene ether and epoxide components. Certain transition metal salts, such as tin salts, may exhibit phase compatibilization as evidenced by behavior characterized by a single glass transition temperature. Additionally, when used with appropriate curing agents and cure accelerators, e.g., catalysts, enhanced cure characteristics of the compositions can be realized. The effective amount of the compatibilizing agent ranges typically from about 0.05 to about 6.0% by weight, more particularly about 0.1 to about 5.0% by weight, e.g., about 1 to about 5% by weight, of the polyphenylene ether and epoxide components. In some examples, about 5% by weight of a transition metal salt, e.g., zinc octoate, may be used as a compatibilizing agent. Exemplary zinc salts include, for example, zinc octoate, di-alkyl zinc dicarboxylates, zinc mercaptides, zinc acetate, zinc oxide, zinc citrate, zinc oxylate, zinc acetylacetonate, zinc stearate, zinc naphthenate and the like and even mixtures thereof. Exemplary tin metal salts include, for example, stannous octoate, di-alkyl tin dicarboxylates such as dibutyl tin dicarboxylates (e.g. dibutyl tin dioctoate), tin mercaptides (e.g. dibutyl tin dilauryl mercaptide), stannous acetate, stannic oxide, stannous citrate, stannous oxylate, stannous chloride, stannic chloride, tetraphenyl tin, tetra-butyl tin, tri-n-butyl tin acetate, di-n-butyl tin dilaurate, dimethyl tin dichloride, and the like and even mixtures thereof. In some examples, the compatibilizing agent may also act as a catalyst to promote reaction between the polyphenylene ether and epoxide components.

In accordance with certain other examples, silane coupling agents can be used in the compositions disclosed herein. Exemplary silanes include, but are not limited to, 3-(2-aminoethyl)-aminopropyl trimethoxysilane, gamma-aminopropyl triethoxysilane, and glycidoxypropyl trimethoxysilane. Silanes can be used as co-catalysts or can be the primary catalyst.

In accordance with certain other examples, the compositions disclosed herein may also include additional compounds to maximize homogeneity. For examples, fatty acid salts, detergents, surfactants, oils, metal compounds, e.g., titanium compounds, and the like may be added to increase homogeneity. Additional suitable compounds for increasing homogeneity will be readily selected by the person of ordinary skill in the art, given the benefit of this disclosure.

In accordance with certain examples, the compositions disclosed herein may also include one or more additional materials. For example, the compositions can include inert, particulate fillers such as talc, clay, mica, silica, alumina, Fuselex, Minusil 5, spodumene, and calcium carbonate. In examples comprising fillers, about 100 to about 250 parts by weight filler is typically mixed with about 100 parts of the flame retardant composition. Fabric wettability enhancers (e.g., wetting agents and coupling agents) and polar liquids such as n-butyl alcohol, methyl ethyl ketone, polysiloxanes, and tetrahydrofuran, may be advantageous under certain conditions. Such materials as antioxidants, thermal and ultraviolet stabilizers, lubricants, antistatic agents, dyes, and pigments may also be present.

In accordance with certain examples, the compositions disclosed herein are typically dissolved in an effective amount of an inert solvent, e.g., an inert organic solvent, typically to a solute content of about 20% to about 40% by weight of varnish, more particularly about 25% to about 40% by weight, e.g., about 25% to about 35% by weight total varnish. The nature and identity of the solvent is not critical, provided that the solvent is amenable to removal through facile means, such as evaporation. In certain examples, aromatic hydrocarbons, such as benzene and toluene, are used. In other examples, Dowanol PM, acetone, glycol ethers and ketone solvents may be used. The order of blending and dissolution is also not critical; however, in order to avoid premature curing, catalyst and hardener components generally should not be brought initially into contact with the epoxide components at a temperature above about 60° C.

In accordance with certain examples, materials that improve the solvent resistance of the compositions may also be included. For example, a material whose presence in minor amounts may improve the solvent resistance and compatibility of the composition is at least one aliphatic tris(dialkylphosphato)titanate. Suitable phosphatotitanates are known in the art and commercially available. Exemplary phosphatotitanates may be represented by the formula (VIII) shown below.

(VIII)

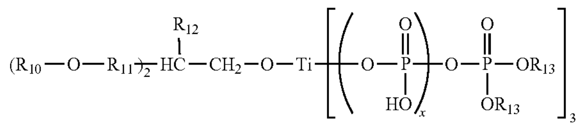

wherein $R_{10}$ is C2-6 primary or secondary alkyl or alkenyl and more particularly alkenyl, $R_{11}$ is C1-3 alkyl and more particularly methyl, $R_{12}$ is C1-5 primary or secondary alkyl, $R_{13}$ is a straight chain or branched hydrocarbon having one to eight carbon atoms, and x is from 0 to about 3, more particularly 0 or 1. In some examples, $R_{10}$ is alkyl, $R_{11}$ is methyl, $R_{12}$ is ethyl, $R_{13}$ is octyl and x is 0. The phosphatotitanate may be present in an amount of about 0.1-1.0 part by weight per 100 parts of the composition, more particularly about 0.2 to about 0.8 parts by weight per 100 parts of the composition, e.g., about 0.4 to about 0.6 parts by weight per 100 parts of the composition. It will be within the ability of the person of ordinary skill in the art, given the benefit of this disclosure, to select suitable materials and suitable amounts of the materials to improve the solvent resistance of the compositions disclosed herein.

In accordance with certain examples, a halogen-free or substantially halogen-free composition comprising a flame retardant amount of chemically combined phosphorous and having a glass transition temperature of at least about 120° C. is disclosed. In certain examples, the composition may include a halogen-free or substantially halogen-free epoxide and a phosphorated compound, e.g., a flame retardant amount of chemically combined phosphorous. The exact parts by weight of the halogen-free or substantially halogen-free epoxide and phosphorated compound can vary so long as the glass transition temperature of the composition is about 140° C. or greater. In certain examples, the composition comprises about 50% to about 95% by weight of halogen-free epoxide or about 50% to about 95% by weight of a substantially halogen-free polyepoxide. In yet other examples, the composition comprises about 5% to about 30%, by weight of one or more phosphorated compounds. In some examples, the flame retardant amount of chemically combined phosphorous is about 3%, 6%, or about 3-6% by weight phosphorous based on the weight of the composition. The epoxide and phosphorated compound may be any of those components discussed herein and other suitable components that will be readily selected by the person of ordinary skill in the art, given the benefit of this disclosure. For example, the phosphorated compound may be a compound with a particle size less than about 10 microns, or may be a particle providing a surface area of 78.5 $\mu m^2$ to about 1965 $m^2$. The composition may optionally include one or more other components, as discussed herein, e.g., a polyphenylene ether, a co-flame retardant, a filler, etc. It will be within the ability of the person of ordinary skill in the art, given the benefit of this disclosure, to select suitable additional materials for including in the compositions disclosed herein.

In accordance with certain examples, a halogen-free or substantially halogen-free composition comprising a flame retardant amount of chemically combined phosphorous and providing a peel strength of at least about 4 lb/inch width as tested by IPC-TM-650 2.4.8C is disclosed. The IPC-TM-650 2.4.8C test method (dated 12/94 and entitled "Peel Strength of Metallic Clad Laminates") is incorporated herein by reference in its entirety for all purposes. In certain examples, the composition may include a halogen-free or substantially halogen-free epoxide and a phosphorated compound, e.g., a flame retardant amount of chemically combined phosphorous. The exact parts by weight of the halogen-free or substantially halogen-free epoxide and phosphorated compound can vary so long as the peel strength of the composition is at least about 4 lb/inch width as tested by IPC-TM-650 2.4.8C. In certain examples, the composition comprises about 50% to about 95%, by weight of halogen-free epoxide or about 50% to about 95%, by weight of a substantially halogen-free polyepoxide. In yet other examples, the composition comprises about 5 to about 30% by weight of one or more phosphorated compounds. In some examples, the flame retardant amount of chemically combined phosphorous is about 3%, 6%, or about 3-6% by weight phosphorous based on the weight of the composition. The epoxide and phosphorated compound may be any of those components discussed herein and other suitable components that will be readily selected by the person of ordinary skill in the art, given the benefit of this disclosure. For example, the phosphorated compound may comprise an average particle size less than about 10 microns, or may provide a surface area of 78.5 $\mu m^2$ to about 1965 $m^2$. The composition may optionally include one or more other components, as discussed herein, e.g., a polyphenylene ether, a co-flame retardant, a filler, etc. It will be within the ability of the person of ordinary skill in the art, given the benefit of this disclosure, to select suitable additional materials for including in the compositions disclosed herein.

In accordance with certain examples, a halogen-free or substantially halogen-free composition comprising a flame retardant amount of chemically combined phosphorous and having a dielectric constant at 1 MHz (50% resin content) of about 5.0 or less as tested by the two fluid cell method is disclosed. The two fluid cell method is described in IPC-TM-650 2.5.5.3C dated 12/87 and entitled "Permittivity (Dielectric Constant) and Loss Tangent (Dissipation Factor) of Materials (Two Fluid Cell Method)," the entire disclosure of which is incorporated herein by reference for all purposes. In certain examples, the composition may include a halogen-free or substantially halogen-free epoxide and a phosphorated compound, e.g., a flame retardant amount of chemically combined phosphorous. The exact parts by weight of the halogen-free or substantially halogen-free epoxide and phosphorated compound can vary so long as the dielectric constant at 1 MHz (50% resin content) of the composition is about 5.0 or less. In certain examples, the composition comprises about 50-95% by weight of halogen-free epoxide or about 50-95% by weight of a substantially halogen-free polyepoxide. In yet other examples, the composition comprises about 5-30% by weight of one or more phosphorated compounds. In some examples, the flame retardant amount of chemically combined phosphorous is about 3%, 6%, or 3-6% by weight phosphorous based on the weight of the composition. The epoxide and phosphorated compound may be any of those components discussed herein and other suitable components that will be readily selected by the person of ordinary skill in the art, given the benefit of this disclosure. For example, the phosphorated compound may comprise an average particle size less than about 10 microns, or may provide a surface area of 78.5 $\mu m^2$ to about 1965 $m^2$. The composition may optionally include one or more other components, as discussed herein, e.g., a polyphenylene ether, a co-flame retardant, a filler, etc. It will be within the ability of the person of ordinary skill in the art, given the benefit of this disclosure, to select suitable additional materials for including in the compositions disclosed herein.

In accordance with certain examples, a halogen-free or substantially halogen-free composition comprising a flame retardant amount of chemically combined phosphorous and having a dielectric dissipation factor at 1 MHz (50% resin content) of about 0.035 or less as tested by the two fluid cell method is provided. In certain examples, the composition may include a halogen-free or substantially halogen-free epoxide and a phosphorated compound, e.g., a flame retardant amount of chemically combined phosphorous. The exact parts by weight of the halogen-free or substantially halogen-free epoxide and phosphorated compound can vary so long as the dielectric dissipation factor at 1 MHz (50% resin content) of the composition is about 0.035 or less. In certain examples, the composition comprises about 50% to about 95% by weight of halogen-free epoxide or about 50% to about 95% by weight of a substantially halogen-free polyepoxide. In yet other examples, the composition comprises about 5% to about 30%, by weight of one or more phosphorated compounds. In some examples, the flame retardant amount of chemically combined phosphorous is about 3%, 6% or about 3-6% by weight phosphorous based on the weight of the composition. The epoxide and phosphorated compound may be any of those components discussed herein and other suitable components that will be readily selected by the person of ordinary skill in the art, given the benefit of this disclosure. For example, the phosphorated compound may comprise an average particle size less than about 10 microns, or may provide a surface area of 78.5 $\mu m^2$ to about 1965 $m^2$. The composition may optionally include one or more other components, as discussed herein, e.g., a polyphenylene ether, a co-flame retardant, a filler, etc. It will be within the ability of the person of ordinary skill in the art, given the benefit of this disclosure, to select suitable additional materials for including in the compositions disclosed herein.

In accordance with certain examples, a halogen-free or substantially halogen-free flame retardant composition comprising a flame retardant amount of phosphorous and having a flame retardancy of V-0 as defined by the UL-94 burn test is disclosed. The UL-94 burn test (dated Jul. 29, 1997), is hereby incorporated herein by reference, in its entirety, for all purposes. In certain examples, the composition may include a halogen-free or substantially halogen-free epoxide and a phosphorated compound, e.g., a flame retardant amount of chemically combined phosphorous. The exact parts by weight of the halogen-free or substantially halogen-free epoxide and phosphorated compound can vary so long as the composition provides a flame retardancy of V-0 as defined by the UL-94 burn test. In certain examples, the composition comprises about 50% to about 95% by weight of halogen-free epoxide or about 50% to about 95% by weight of a substantially halogen-free polyepoxide. In yet other examples, the composition comprises about 5% to about 30% by weight of one or more phosphorated compounds. In some examples, the flame retardant amount of chemically combined phosphorous is about 3%, 6% or about 3-6% by weight phosphorous based on the weight of the composition. The epoxide and phosphorated compound may be any of those components discussed herein and other suitable components that will be readily selected by the person of ordinary skill in the art, given the benefit of this disclosure. For example, the phosphorated compound may comprise an average particle size less than about 10 microns, or may provide a surface area of 78.5 $\mu m^2$ to about 1965 $m^2$. The composition may optionally include one or more other components, as discussed herein, e.g., a polyphenylene ether, a co-flame retardant, a filler, etc. It will be within the ability of the person of ordinary skill in the art, given the benefit of this disclosure, to select suitable polyphenylene ethers, polyepoxides, compatibilizing agents and/or curing agents to provide include suitable flame retardant composition comprising a flame retardant amount of phosphate and having a flame retardancy of V-0 as defined by the UL-94 burn test.

In accordance with certain examples, one or more of the compositions disclosed herein may be used in one or more prepregs. Without wishing to be bound by any particular scientific theory, a prepreg comprises a substrate (e.g., woven or non-woven fibrous substrate) such as glass, quartz, polyester, polyamide, polypropylene, cellulose, nylon or acrylic fibers, low dielectric unidirectional tape, or woven cloth or nonwoven fabric of interbonding fibers with a composition disposed on the substrate. Suitable low dielectric fibers include high strength fibers such as glass fibers, ceramic fibers and aramid fibers, which are commercially available. In certain examples, prepreg fibers may have a consistent fiber orientation. The prepreg is impregnated with a composition, such as any one or more of the compositions disclosed herein, and such prepregs may be cured by application of heat and pressure. Referring now to FIG. 1, prepreg 100 may comprise a generally planar substrate 110 with one or more of the compositions disclosed herein disposed on or in substrate 110. The thickness of the substrate can vary, and in certain examples, the substrate is about 1 mil to about 15 mils thick, more particularly, about 1 mil to about 10 mils thick, e.g., 1-10 mils thick or any thickness in between. It will be within the ability of the person of ordinary skill in the art, given the benefit of this disclosure, to select suitable thicknesses for prepreg substrates.

In accordance with certain examples, a prepreg can be formed by disposing one or more of the compositions disclosed herein on or in a substrate. In certain examples, a substrate can be partially covered or masked so that only a portion of the substrate receives one or more of the compositions described herein. In other examples, substantially all of the substrate receives one or more of the compositions disclosed herein. An applicator, such as a brush, roller, spray nozzle, etc. can apply one or more of the compositions to the substrate. In some examples, one or more additional applications of the composition can be performed such that the substrate is substantially saturated with the composition. In certain examples, one or more areas of the substrate receive a substantially greater amount of the composition than another area. Such differential disposition of the compositions disclosed herein can provide prepregs having areas with different physical and/or electrical properties.

In accordance with certain examples, after disposal of one or more of the compositions on a substrate, the prepreg is typically stacked with other prepregs and the resulting assembly is cured to remove any solvent from the disposed composition. In certain examples, the prepreg stack is cured by placing the prepreg stack in an oven at a temperature above the vaporization temperature of the solvent. The oven temperature causes the solvent to evaporate and cures the prepreg stack. The cured prepreg stack may be used to form numerous devices, such as laminates, molded articles, printed circuit boards, etc. The person of ordinary skill in the art, given the benefit of this disclosure, will be able to use the compositions disclosed herein to form prepregs.

In accordance with certain examples, the prepreg may include additional materials to alter the physical and/or electrical properties of the prepreg. For example, materials such as elastomers, thermoplastics, etc. may be added to the prepreg to alter the properties, e.g., to increase fracture resistance. The prepregs may also include fillers, whiskers, particles and the like to alter the properties of the prepreg. In some examples, the substrate of the prepreg includes, on one or both sides, cloth, a sheet of reinforcing fibers, glass, carbon fibers, aromatics, liquid crystals, fibrous mats, conductive oils, metal foils such as copper foils, etc. It will be within the ability of the person of ordinary skill in the art, given the benefit of this disclosure, to include additional materials in prepregs to impart desired physical and/or electrical properties to the prepreg.

Figure 2B:
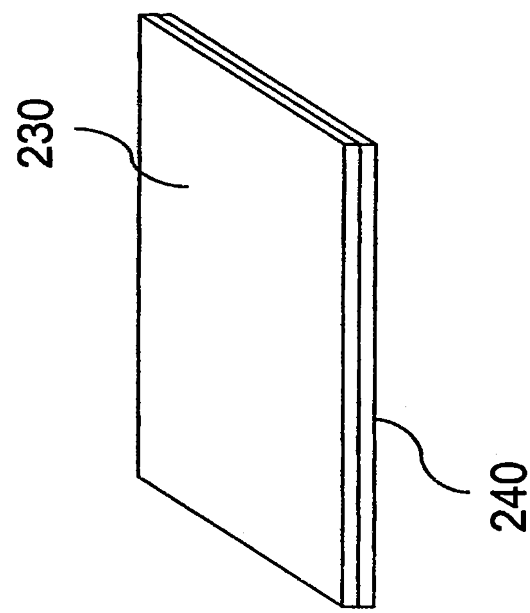
FIGS. 2A and 2B are examples of a laminate, in accordance with certain examples.
Figure 2A:
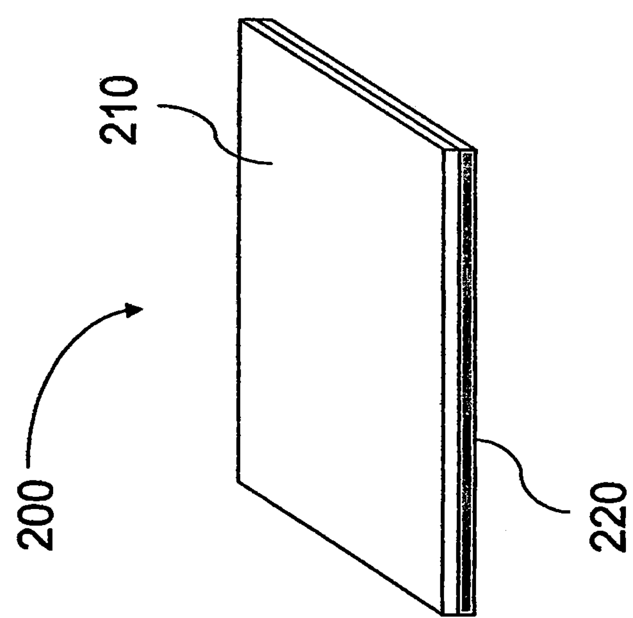

In accordance with certain examples, a laminate comprising at least two layers wherein at least one layer is a prepreg is disclosed. As used here, the term laminate refers to a device comprising at least two layers, wherein one of the layers is a prepreg, more particularly at least about 1 to about 10 layers of the laminate is a prepreg, e.g., about 1 to about 2 layers of the laminate are prepregs. The laminate may include one or more electrically conductive layers, e.g., non-metal or metal foil layers, disposed on one or more sides of the laminate. For example, referring to FIG. 2A, laminate 200 may comprise prepreg 210 and metal foil 220. In other examples, a laminate may comprise two or more prepregs, such as prepreg 230 and prepreg 240 shown in FIG. 2B. Laminates are typically prepared by laminate-pressing, compression molding or laminate molding, as described in numerous publications and patents. For example, laminates can be produced by stacking on one another 1 to 20 pieces of prepreg, placing on one surface or both surfaces of the stacked prepreg a non-metal foil or metal foil, e.g. copper foil, aluminum foil, tin foil, etc., and subjecting the resultant structure to laminate molding. Suitable non-metal foils will be readily selected by the person of ordinary skill in the art, given the benefit of this disclosure, and exemplary non-metal foils include those containing plastics, ceramics, elastomers, carbon black, graphite, and diamond. With respect to the type of metal foil, any suitable metal foil that can be used in the application of electrically insulating materials and/or electrically conductive materials can be used. In addition, as conditions for molding, for example, those used in methods for laminated sheet and multilayer sheet for electrically insulating materials can be employed, and, for example, molding can be conducted using a multi-stage press, a multi-stage vacuum press, a continuous molding machine, or an autoclave molding machine by heating at a suitable temperature, e.g., 100° C. to 250° C. at a pressure of 2 to 100 kg/cm$^2$ for about 0.1 to 5 hours. Further, the prepreg can be combined with a wiring board for inner layer and subjected to laminate molding to produce a multilayer sheet. It will be within the ability of the person of ordinary skill in the art, given the benefit of this disclosure, to produce laminates using the compositions and prepregs described herein.

Figure 3:
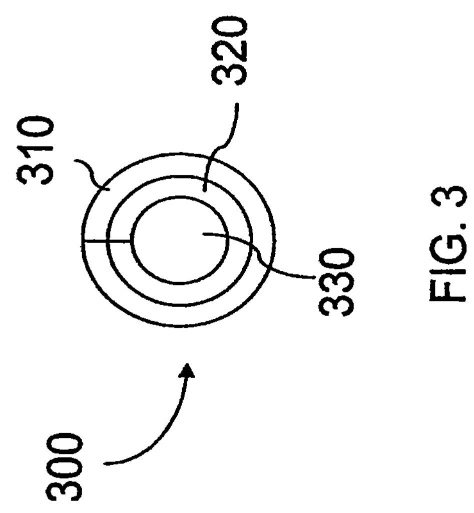
FIG. 3 is an example of a molded article, in accordance with certain examples.

In accordance with certain examples, a molded article comprising one or more of the prepregs disclosed herein is provided. In certain examples, the molded article is produced using one or more of the compositions described herein and suitable fibers to provide a fiber reinforced plastic. In other examples, the molded article is produced from one or more prepregs and formed into a desired shape, such as a tube, by winding layers of prepregs around a device, such as a mandrel, and heating and pressing the layers. In other examples, the molded article is formed in a desired shape to provide, for example, fishing rods, golf club shafts, aircraft panels, aircraft wings, etc. In certain examples, the prepregs are cut to shape prior to curing, whereas in other examples, the prepregs are cured and then cut to a desired shape. It will be within the ability of the person of ordinary skill in the art, given the benefit of this disclosure, to produce molded articles using the compositions and prepregs disclosed herein. Referring to FIG. 3, a tubular molded article 300 comprising at least one prepreg, such as a prepreg 310 and a prepreg 320 is shown. The tubular molded article 300 may be hollow and include a central void 330. Suitable molded articles using the compositions disclosed herein will be readily designed by the person of ordinary skill in the art, given the benefit of this disclosure.

In accordance with certain examples, a printed circuit board comprising one or more of the compositions disclosed herein is provided. Examples of printed circuit boards include a dielectric substrate having an electrically conductive layer, e.g., a wiring layer, on one or more surfaces. In some examples, the electrically conductive layer is formed to have a predetermined pattern. In examples using multiple electrically conductive layers, the layers may be connected electrically with each other. The exact nature of the dielectric substrate can vary, and exemplary materials for dielectric substrates include but are not limited to glass, woven and nonwoven fabrics, and other suitable materials that can receive one or more of the compositions disclosed herein.

Figure 4:
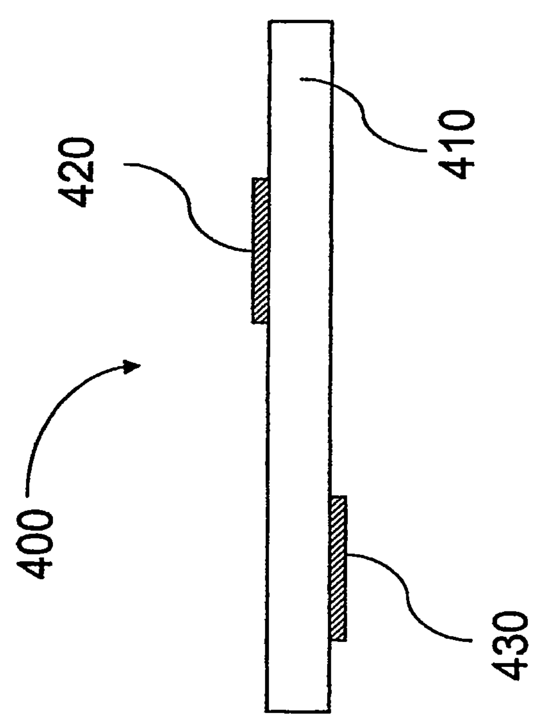
FIG. 4 is an example of a printed circuit board, in accordance with certain examples.

In accordance with certain examples, one or more of the compositions disclosed herein can be disposed on the dielectric substrate, and the resulting assembly can be cured to provide a printed circuit board. In some examples, the dielectric substrate comprises a single layer of material, whereas in other examples the dielectric substrate is a multi-layered structure formed, for example, from a plurality of stacked prepregs. Non-metal or metal foils can also be disposed on one or both surfaces of the dielectric substrate. In certain examples, metal foil can be disposed on one or more surfaces and etched away to provide a predetermined wiring pattern on the dielectric substrate. Referring now to FIG. 4, a printed circuit board 400 may include a dielectric substrate 410 and electrically conductive layers 420 and 430 that have been produced by etching away of a metal foil disposed on the surface of the dielectric substrate 410. In some examples, the etched metal foil on one side of the dielectric substrate is in electrical communication with etched metal foil on an opposite side of the dielectric substrate through a channel, conduit, via or hole in the dielectric substrate. In other examples, the electrically conductive layers are not in electrical communication with each other. Suitable methods for preparing printed circuit boards including the compositions disclosed herein will be readily selected by the person of ordinary skill in the art, given the benefit of this disclosure.

In accordance with certain examples, a method of facilitating assembly of a prepreg is disclosed. The method includes providing one or more of the compositions disclosed herein. In certain examples, the method includes providing instructions for disposal of the composition on a substrate to form a prepreg. It will be within the ability of the person of ordinary skill in the art, given the benefit of this disclosure, to provide suitable halogen-free or substantially halogen-free flame retardant compositions for facilitating assembly of prepregs.

Certain specific examples of compositions and their use in prepregs and laminates are discussed in more detail below. All parts and percentages are by weight unless otherwise indicated.

COMPARATIVE EXAMPLE

Two compositions were prepared to compare the effect of using a phosphorated compound with a particle size of less than 10 microns on flame retardancy. A first composition was prepared using 35 parts by weight solvent (Dowanol PM), 12 parts by weight Melapur® 200 (mean particle size of 25 microns), 12 parts by weight Clarion OP-930, 60 parts by weight Hexion Epon 828, 3 parts by weight Epon 1031, 37 parts by weight of a phenol/formaldehyde novolac (Bakelite's IZ6635), and 0.1 parts by weight 2-methylimidazole as a catalyst.

A second composition was prepared using 35 parts by weight solvent (Dowanol PM), 12 parts by weight Melapur® 200 (mean particle size of 8 microns), 12 parts by weight Clarion OP-930, 60 parts by weight Hexion Epon 828, 3 parts by weight Epon 1031, 37 parts by weight of a phenol/formaldehyde Novolac (Bakelite's IZ6635), and 0.1 parts by weight 2-methylimidazole as a catalyst.

To prepare each composition the following procedure was used: The flame retardants and inert fillers were pre-dispersed in Dowanol PM. To this dispersion, the epoxies (Hexion Epon 828 and Epon 1031) and Novolac were added under constant agitation. The 2-methylimidazole catalyst was added and the varnish was allowed to age a minimum 12 hrs prior to treating.

Each of the compositions was applied to glass cloth style 7628 (obtained commercially from BGF Industrials, Inc.) and treated in a Despatch LFD2-II-3 oven with air ventilation and circulation at 171° C. for 3 minutes to form a prepreg. The prepreg was pressed to a 4-ply laminate at 390° C. under 100 psi pressure using a Wabash hydraulic press for 4 to 5 hours with ½ ounce copper foil clad (obtained from Gould Electronics, Inc.) on both sides. An 8-ply 7628 glass style prepreg was used for the UL-94 burn test.

The burn time of the prepreg that included the first composition (25 micron particles) was about 56 seconds, which is equivalent to a V1 rating under the UL-94 test. The burn time of the prepreg that include the second composition (8 micron diameter particles) was 39 seconds, which is equivalent to a V0 rating under the UL-94 test. Burn time was reduced by over 30% when using the Melapur® 200 component having a mean particle diameter of 8 microns when compared to the burn time obtained using Melapur® 200 component having a mean particle diameter of 25 microns.

When introducing elements of the examples disclosed herein, the articles "a," "an," "the" and "said" are intended to mean that there are one or more of the elements. The terms "comprising," "including" and "having" are intended to be open ended and mean that there may be additional elements other than the listed elements. It will be recognized by the person of ordinary skill in the art, given the benefit of this disclosure, that various components of the examples can be interchanged or substituted with various components in other examples. Should the meaning of the terms of the priority application incorporated herein by reference conflict with the meaning of the terms used in this disclosure, the meaning of the terms in this disclosure are intended to be controlling.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A substantially halogen-free composition, comprising:
an epoxide; and
a flame retardant amount of chemically combined phosphorous from a phosphorated compound having an average particle size of less than about 10 microns, the substantially halogen-free composition having a flame retardancy of V-0 as defined by the UL-94 burn test,
wherein an amount of the epoxide is about 40% to about 90% by weight, and wherein the amount of the phosphorated compound is about 5% to about 30% by weight.

2. The composition of claim 1 having a glass transition temperature of at least about 120° C.

3. The composition of claim 1 having a peel strength of at least about 4 lb/inch width as tested by IPC-TM-650 2.4.8C.

4. The composition of claim 1 having a dielectric constant at 1 MHz (50% weight resin) of less than about 5.0 as tested by IPC-TM-650 2.5.5.3C.

5. The composition of claim 1 having a dielectric dissipation factor at 1 MHz (50% resin content) of about 0.035 or less as tested by IPC-TM-650 2.5.5.3C.

6. The composition of claim 1, wherein the epoxide is a polyepoxide.

7. The composition of claim 6, wherein the polyepoxide is a difunctional epoxide, a tetrafunctional epoxide, or an aromatic multi-functional epoxide.

8. The composition of claim 1, further comprising a catalyst selected from the group consisting of imidazole, 1-methylimidazole, 1,2-dimethylimidazole, 2-methylimidazole, 2-heptadecylimidazole, 2-ethyl-4-methylimidazole, 2-undecylimidazole, 1-(2-cyanoethyl)-2-phenylimidazole, diethyltoluenediamine, tris(dimethylaminomethyl)-phenol, 3-phenyl-1,1-dimethyl urea and mixtures thereof.

9. The composition of claim 1, further comprising at least one co-flame retardant.

10. The composition of claim 1, wherein the phosphorated compound is an organic phosphate.

11. The composition of claim 1, wherein the phosphorated compound has a formula of :

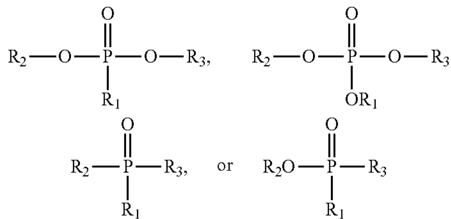

in which $R_1$, $R_2$ and $R_3$ each is independently selected from the group consisting of alkyl, aryl, and alicyclic and heterocyclic groups that include nitrogen, oxygen and/or phosphorous.

12. The composition of claim 1, wherein the phosphorated compound comprises particles with a surface area of at least about 78.5 $\mu m^2$ to about 1965 $\mu m^2$.

* * * * *